United States Patent
Sandberg et al.

(10) Patent No.: US 11,196,383 B2
(45) Date of Patent: Dec. 7, 2021

(54) TUNABLE OSCILLATOR DEVICE

(71) Applicant: Telefonaktiebolaget LM Ericsson (publ), Stockholm (SE)

(72) Inventors: Jan Sandberg, Frillesås (SE); Mikael Hörberg, Torslanda (SE); Per Ligander, Gothenburg (SE); Anatoli Deleniv, Mölndal (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 16/972,380

(22) PCT Filed: Jun. 20, 2018

(86) PCT No.: PCT/EP2018/066499
§ 371 (c)(1),
(2) Date: Dec. 4, 2020

(87) PCT Pub. No.: WO2019/242859
PCT Pub. Date: Dec. 26, 2019

(65) Prior Publication Data
US 2021/0234509 A1 Jul. 29, 2021

(51) Int. Cl.
*H01P 7/06* (2006.01)
*H03B 5/18* (2006.01)

(52) U.S. Cl.
CPC ............ *H03B 5/1841* (2013.01); *H01P 7/06* (2013.01); *H03B 5/1817* (2013.01); *H03B 2200/009* (2013.01)

(58) Field of Classification Search
CPC .... H01P 5/04; H01P 5/107; H01P 7/06; H01P 7/065; H03B 5/18; H03B 5/1817;
(Continued)

(56) References Cited

U.S. PATENT DOCUMENTS 2,919,419 A * 12/1959 Rivers .................. H01P 7/06
333/232
3,388,348 A    6/1968 Gregory
(Continued)

FOREIGN PATENT DOCUMENTS

| JP | 5652910 A | 5/1981 |
|---|---|---|
| WO | 2009036134 A1 | 3/2009 |
| WO | 2016066227 A1 | 5/2016 |

OTHER PUBLICATIONS

Hörberg, M., "Low Phase Noise GaN HEMT Oscillator Design Based on High-Q Resonators", Thesis for the Degree of Doctor of Philosophy, Apr. 1, 2017, pp. 1-95, Chalmers University of Technology.
(Continued)

*Primary Examiner* — Levi Gannon
(74) *Attorney, Agent, or Firm* — Coats & Bennett, PLLC

(57) ABSTRACT

The present disclosure relates to an oscillator device (15) comprising an amplifier unit (16) and a tunable waveguide resonator (1) which in turn comprises a rectangular waveguide part (2) having electrically conducting inner walls (3) and a first waveguide port (4). The amplifier unit (16) is arranged to be electrically connected to the waveguide resonator (1) via the first waveguide port (4) by means of a first connector (17). The waveguide resonator (1) comprises at least one tuning element (6) positioned within the waveguide part (2), wherein each tuning element (6) comprises an electrically conducting body (7) and a holding rod (8a, 8b). The holding rod (8a, 8b) is attached to the electrically conducting body (7) and is movable from the outside of the waveguide resonator (1) such that the electrically conducting body (7) can be moved between a plurality of positions within the waveguide part (2) by means of the holding rod (8a, 8b).

12 Claims, 6 Drawing Sheets

(58) Field of Classification Search
CPC .. H03B 5/1823; H03B 5/1829; H03B 5/1841; H03B 2200/009
See application file for complete search history.

(56) References Cited

U.S. PATENT DOCUMENTS

2005/0040916 A1   2/2005 Park et al.
2006/0119454 A1*  6/2006 Kornowski ............... H01P 7/06
                                                   333/227

OTHER PUBLICATIONS

Hörberg, M. et al., "Phase-Noise Analysis of an X-Band Ultra-Low Phase-Noise GaN HEMT Based Cavity Oscillator", IEEE Transactions on Microwave Theory and Techniques, vol. 63 No. 8, Aug. 1, 2015, pp. 2619-2629, IEEE.
Chen, J et al., "Does LO Noise Floor Limit Performance in Multi-Gigabit Millimeter-Wave Communication?", IEEE Microwave and Wireless Components Letters, vol. 27 No. 8, Aug. 1, 2017, pp. 769-771, IEEE.

* cited by examiner

TUNABLE OSCILLATOR DEVICE

TECHNICAL FIELD

The present disclosure relates to an oscillator device comprising an amplifier unit and a tunable waveguide resonator which in turn comprises a rectangular waveguide part having electrically conducting inner walls and a first waveguide port.

BACKGROUND

Oscillators are used for delivering a signal with a predetermined frequency, which may be adjustable. However, all oscillators that are set to a certain frequency tend to vary slightly around said frequency. This variation is known as phase noise.

In order to achieve low phase noise in an oscillator, it is well known that one of the main contributing parameters is the losses of the resonator, measured by its so-called Q value, where a high Q means low losses and low phase noise. Especially for a Voltage Controlled Oscillator (VCO) where an electrical tuning element is coupled to the resonator, it is very difficult to acquire a low phase noise.

There exist a vast number of different technologies for realizing an oscillator. Basically, an oscillator is formed by an amplifier that is coupled to a resonator, where the resonator normally incorporates the tuning element and where the degree of coupling of the tuning element to the resonator determines the relative tuning bandwidth. Normal ranges for the tuning vary from single percentages to about 30 percentages.

A resonator can be built from microstrip or stripline structures on a substrate. It can also be built from discrete LC components, dielectric resonators, waveguide cavities or variants of these. The tuning element can be a varactor diode, ferroelectric material or some other variable reactance structure. The total Q of a resonator structure depends on the combined resistive losses of the respective components.

Using a waveguide cavity in a tunable resonator for a VCO that has low insertion loss requires a high Q-factor and a large spurious-free frequency band. It is also important that a tunable resonator is reliable and cheap in mass production.

In all existing resonator structures, the common problem is that as soon as a tuning element is coupled to a resonator such as a cavity, the losses of the tuning element will lower the Q and thereby the phase noise will be increased. The tighter the coupling between the tuning element and the resonator is, the wider bandwidths may be obtained, but also the more losses occur, and then the phase noise is increased.

An oscillator comprising a waveguide cavity resonator is described in WO 2016/066227, here rows of electrical switches are used to form an electrical wall, enabling the size of the cavity to be changed by means of the state of the switches, allowing electrically controlled tuning of the oscillator.

However, there is still a desire to obtain a possibility for fine tuning without increasing the losses.

There is thus a need for an enhanced oscillator device, where fine tuning is obtained without increasing the losses and having a relatively large spurious-free frequency band.

SUMMARY

The object of the present disclosure is to provide an enhanced oscillator device, where fine tuning is obtained without increasing the losses.

This object is achieved by means of an oscillator device comprising an amplifier unit and a tunable waveguide resonator which in turn comprises a rectangular waveguide part having electrically conducting inner walls and a first waveguide port. The amplifier unit is arranged to be electrically connected to the waveguide resonator via the first waveguide port by means of a first connector, where the waveguide resonator comprises at least one tuning element positioned within the waveguide part. Each tuning element comprises an electrically conducting body and a holding rod that is attached to the electrically conducting body and is movable from the outside of the waveguide resonator such that the electrically conducting body can be moved between a plurality of positions within the waveguide part by means of the holding rod.

The conductor loading, the electrically conducting body, does not require ohmic contact with the cavity wall of the waveguide part and is therefore not dependent on its quality. In that follows that Q-factor is maintained on the level defined mainly by size of the load of the electrically conducting body and the cavity of the waveguide part. Moving the electrically conducting body inside the cavity, i.e. tuning its resonance frequency, does not affect the Q-factor. It is furthermore well known that conductor loaded cavities, such as where the electrically conducting body is positioned within in the waveguide part, have wide spurious-free frequency bands. This provides an oscillator device with a compact tunable waveguide resonator that has a high Q-factor and a wide spurious-free frequency band.

This also provides reduced size since it uses a fundamental TE101 mode of a rectangular cavity. Due to conductor loading of the electrically conducting body positioned within in the waveguide part, the size is further reduced.

Feeding a high Q-cavity with an amplifier gives a low noise tunable Voltage-controlled oscillator (VCO). The tuning element is not sensitive to high RF voltage swing which makes it possible to use a very high voltage in the amplifier unit and thereby increase the dynamic range and further improve the phase noise.

According to some aspects, the waveguide part comprises a surface-mountable waveguide part which is arranged to be mounted to a printed circuit board (PCB) such that a metallization on the PCB constitutes an inner wall of the waveguide part.

This provides an advantage related to cost-effective manufacturing in a surface-mount assembly line.

According to some aspects, the amplifier unit is positioned outside the waveguide part and is arranged to be electromagnetically connected to the waveguide part via an opening, said opening constituting the first waveguide port.

According to some aspects, the oscillator device comprises a coupling arrangement that comprises a coupling patch connected to the first connector.

According to some aspects, the oscillator device comprises a coupling arrangement that comprises a waveguide ridge that is electrically connected to the waveguide part.

The above coupling arrangements provide uncomplicated and reliable coupling.

According to some aspects, the holding rod is electrically conducting.

This enables manufacture of the holding rod and the electrically conducting body as a single part.

According to some aspects, the holding rod is extending through the waveguide part via corresponding apertures, where these apertures cross a plane running through the waveguide part parallel to an extension axis of the holding rod when mounted. Only a mode with an electrical wall in the plane is excited within the apertures such that power leakage via the apertures is avoided.

According to some aspects, the holding rod is connected to an electrically controllable motor.

In this way, an electrically controlled tuning, that can be adaptable, is enabled.

According to some aspects, the electrically conducting body is a cylindrical part.

In this way, the electrically conducting body can be rotated without changing its shape in the waveguide part, for example if the moving of the electrically conducting body is performed by rotating the holding rod.

According to some aspects, the tuning element is integrally formed as one part.

Alternatively, the holding rod comprises two separate rod parts that are attached to opposite sides of the electrically conducting body.

Alternatively, the holding rod comprises one integral part that is running through the electrically conducting body.

In this way, the tuning element can be manufactured in many suitable manners.

According to some aspects, the oscillator device comprises a varactor diode that is arranged to be electrically connected to the waveguide resonator via a second waveguide port by means of a second connector.

In this way, a further possibility of electrically controlled fine tuning is enabled.

BRIEF DESCRIPTION OF THE DRAWINGS

The present disclosure will now be described more in detail with reference to the appended drawings, where.

DETAILED DESCRIPTION

Figure 1:
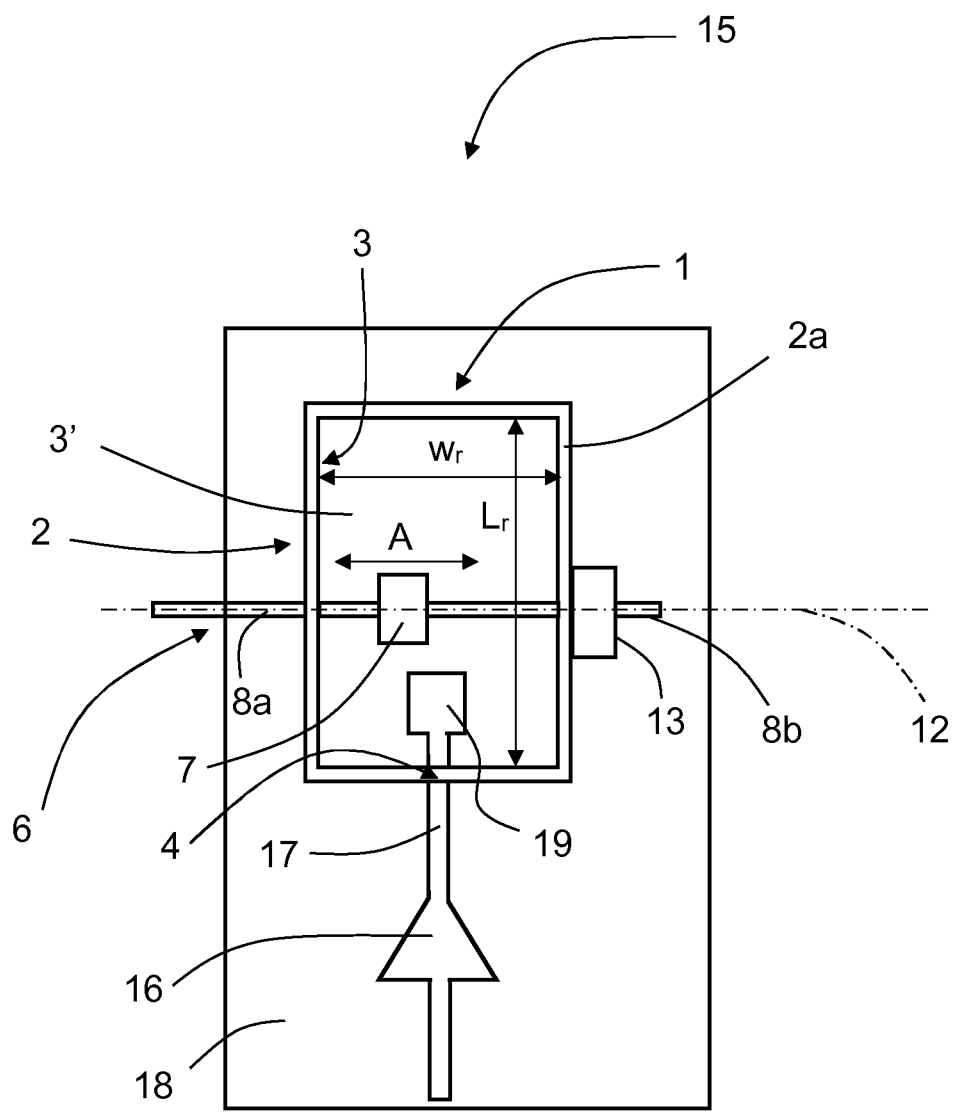
FIG. 1 shows a schematic cut-open top view of an oscillator device according to a first example the present disclosure.
Figure 2:
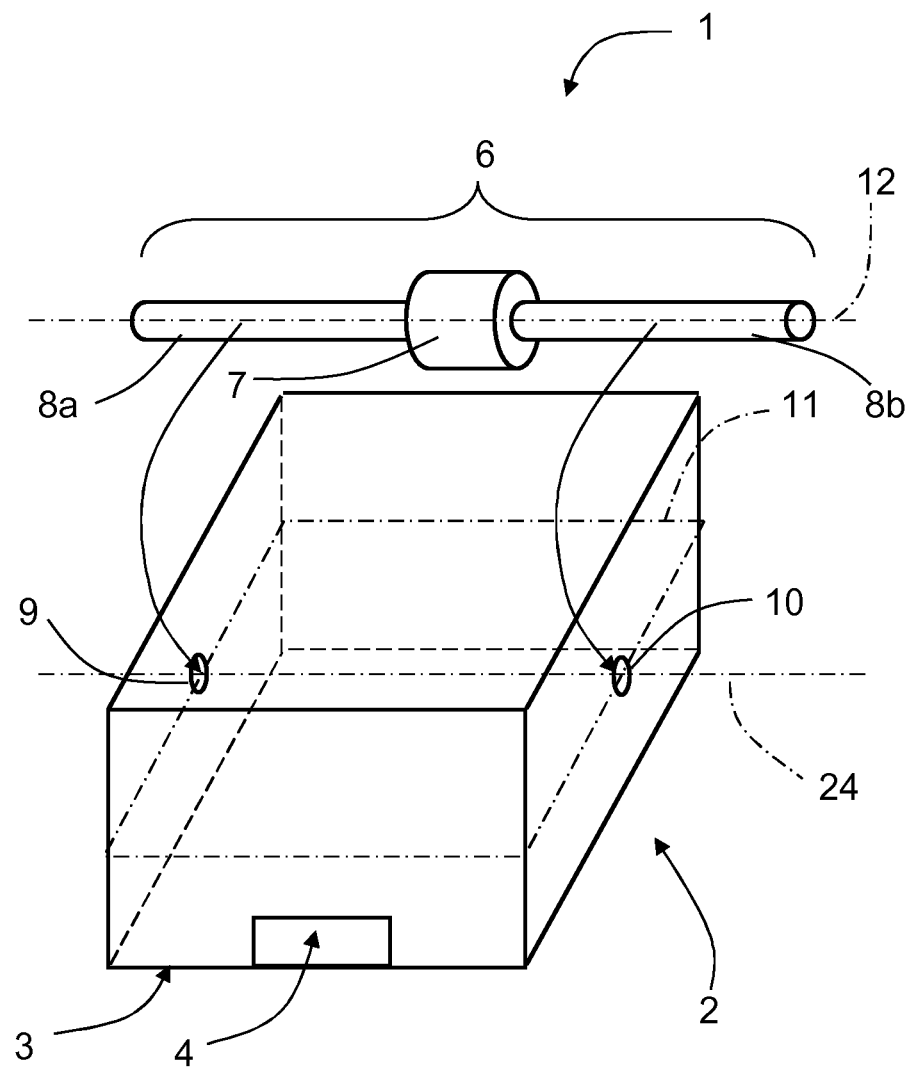
FIG. 2 shows a schematic perspective view of a tunable waveguide resonator.

In the following, reference Is made to FIG. 1, showing a schematic cut-open top view of a first example of an oscillator device, and FIG. 2, showing a schematic perspective view of a tunable waveguide resonator.

There is an oscillator device 15 which comprises an amplifier unit 16 and a tunable waveguide cavity resonator 1. The waveguide resonator 1 comprises a rectangular waveguide part 2 having electrically conducting inner walls 3 and a first waveguide port 4.

The amplifier unit 16 is positioned outside the waveguide part 2 and is arranged to be electromagnetically connected to the waveguide part 2 via a first waveguide port 4 by means of a first connector 17, according to some aspects an opening 4 constitutes the first waveguide port.

The waveguide resonator 1 comprises a tuning element 6 positioned within the waveguide part 2. According to the present disclosure, the tuning element 6 comprises an electrically conducting body 7 and a holding rod 8a, 8b, where the holding rod 8a, 8b is attached to the electrically conducting body 7 and is movable from the outside of the waveguide resonator 1. In this manner, the electrically conducting body 7 can be moved between a plurality of positions within the waveguide part 2 by means of the holding rod 8a, 8b along a lateral extension A.

According to some aspects, the waveguide part 2 comprises a surface-mountable waveguide part 2a, which is arranged to be mounted to a printed circuit board (PCB) 18 such that a metallization on the PCB 18 constitutes an inner wall 3a of the waveguide part 2.

According to some aspects, the holding rod 8a, 8b and the electrically conducting body 7 form the tuning element 6 as an integral electrically conducting part, alternatively the holding rod comprises two separate rod parts 8a, 8b that are attached to opposite sides of the electrically conducting body 7 or one rod that runs through the tuning element 6. In the latter cases, the holding rod 8a, 8b can either be electrically conducting or not.

The holding rod 8a, 8b is extending through the waveguide part 2 via corresponding apertures 9, 10, enabling the electrically conducting body 7 to be movable from the outside of the waveguide resonator 1, and by moving the electrically conducting body 7 and thus displacing the electrically conducting body 7 within the waveguide part 2, the waveguide resonator 1 can be tuned with respect to its resonance frequency with a relatively high Q-value. The electrically conducting body 7 provides conductor loading and tuning the waveguide resonator over the frequency as it moves from the middle of the cavity, at the lowest frequency, towards the cavity wall, resulting in increasing frequency.

By means of the present disclosure, a low phase noise voltage-controlled oscillator (VCO) device 15 is based on a negative resistance amplifier unit 16, and a resonant cavity with analogue tuning by means of the electrically conducting body 7 that is movable from the outside of the waveguide resonator 1.

Figure 3:
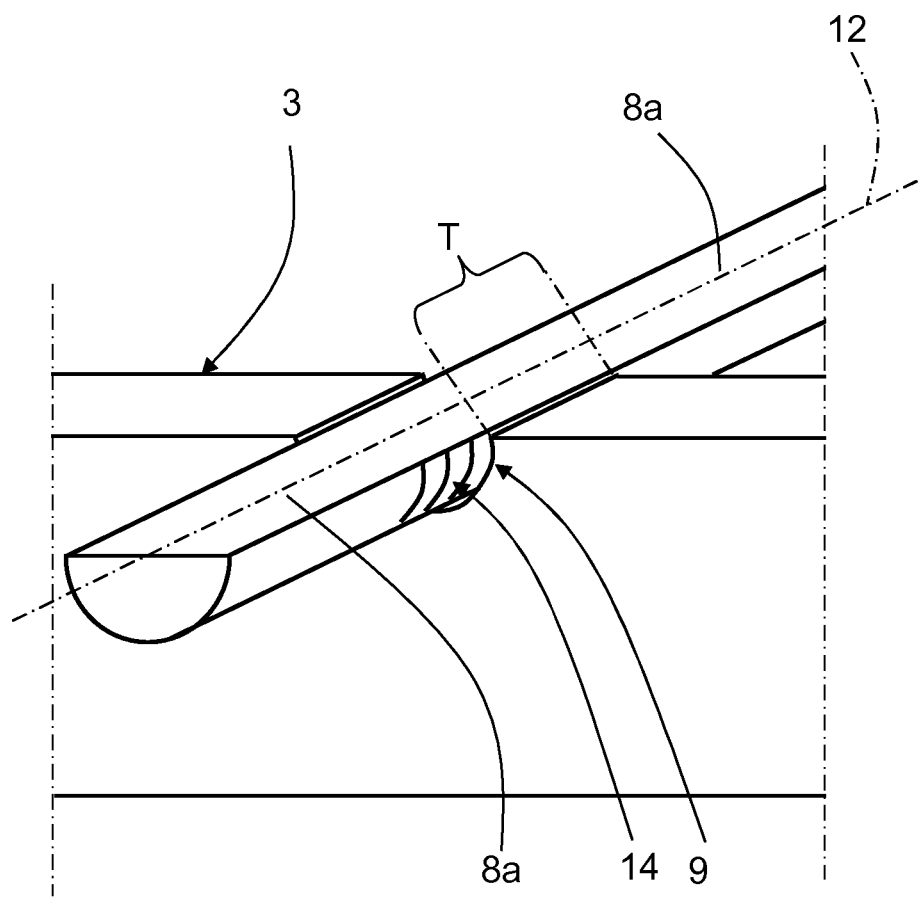
FIG. 3 shows a schematic section perspective detail view of a second example of tunable resonator.

With reference also to FIG. 3 that shows an enlarged section of a first aperture through a plane 11, in order to displace the electrically conducting body 7 within the waveguide part 2 in a controlled manner, according to some aspects, the apertures 9, 10 comprise threads (not visible) that engage corresponding threads 14 at the holding rod 8a, 8b. By means of the threads, angular rotation can be converted into a very precise linear movement of the electrically conducting body 7 inside the cavity.

The apertures 9, 10 cross the plane 11 that runs through the waveguide part 2 parallel to an extension axis 12 of the holding rod 8a, 8b when mounted, then coinciding with another extension axis 24 that runs through the apertures 9, 10. Only a mode with an electrical wall in the plane 11 is excited within the apertures 9, 10 such that power leakage via the apertures 9, 10 is avoided. This is the result since the excited mode is a non-propagating mode in a coaxial line, where a coaxial line is established by means of the holding rod 8a, 8b and the apertures 9, 10 serving as inner respective outer conductors.

Leakage of the power from the resonance cavity takes form of an evanescent wave that quickly decays in the apertures 9, and with a properly chosen thickness T of the waveguide part's wall power leakage via the apertures 9, 10 is avoided.

In the case of an electrically conducting holding rod 8a, 8b, there is no need for a good ohmic contact between the holding rod 8a, 8b and the waveguide part 2 since the connection is provided by a virtual electric wall between them. Since there is no voltage drop between the electrically conducting body 7 and the electrically conducting inner walls 3 in the plane 11, there is no current and thus no associated losses.

According to some aspects, the electrically conducting body 7 is a cylindrical part, resulting in that the resonance frequency of the cavity is not sensitive to the angular position of the electrically conducting body 7. In the case where a rotational movement of the holding rod 8a, 8b is used for moving the electrically conducting body 7, which then rotates along this movement, this is advantageous.

The present disclosure is based on using a conductor-loaded fundamental mode TE101 rectangular cavity. This results in an increased spurious-free rejection band and reduced size. According to some aspects, the conductor loading has rotational symmetry and interconnects the opposite electrically conducting inner walls 3.

By means of the present disclosure a reduced size is obtained since a fundamental TE101 mode of a rectangular cavity is used. Due to conductor loading that is used to tune the cavity over chosen frequency range, the size is further reduced. Furthermore, conductor loaded cavities have a wide spurious-free frequency band, and since, as mentioned previously, the conductor loading does not require ohmic contact with the conducting inner walls, it is not dependent on its quality. In that follows that the Q-factor of the conductor loaded cavity is maintained on a level defined mainly by the size of the electrically conducting body 7 and the cavity. Moving the electrically conducting body 7, that constitutes a load, inside the cavity, i.e. tuning its resonance frequency, affects the Q-factor to a very small extent.

According to some aspects, the oscillator device 15 comprises a coupling arrangement that comprises a coupling patch 19 connected to the first connector 17. According to some further aspects, the oscillator device 15 comprises an electrically controllable motor 13, where the holding rod 8a, 8b is connected to the electrically controllable motor 13. In this way, it is possible to electrically control the position of the electrically conducting body 7 within the waveguide part 2 and thus the resonance frequency of the tunable resonator 1. In this example, the apertures 9, 10 comprise threads that engage corresponding threads 14 at the holding rod 8a, 8b as discussed previously with reference to FIG. 3.

Figure 4:
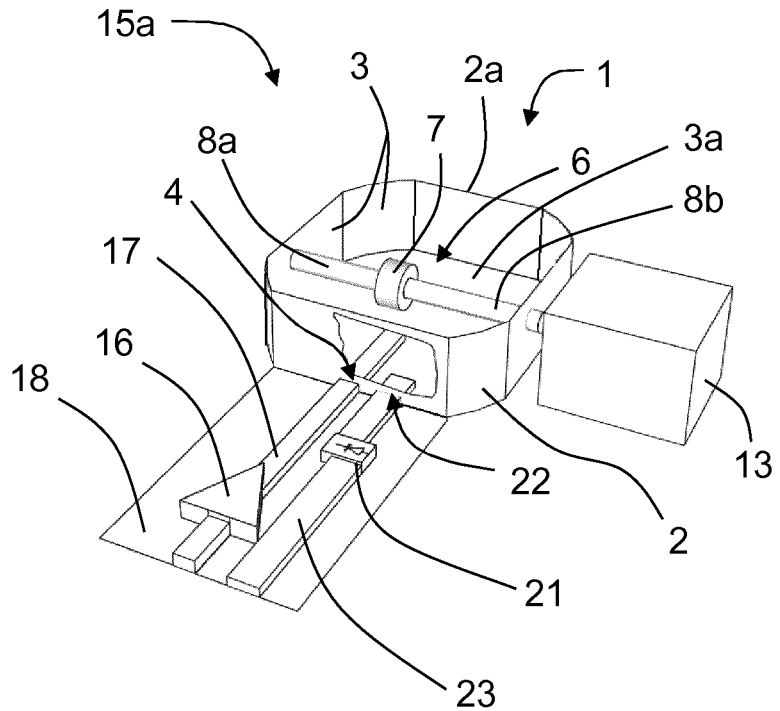
FIG. 4 shows a schematic perspective view of an oscillator according to a second example of the present disclosure.

As shown in a schematic perspective view of a second example of an oscillator device 15a in FIG. 4, according to some aspects, the oscillator device 15a comprises a varactor diode 21 that is arranged to be electrically connected to the waveguide resonator 1 via a second waveguide port 22 by means of a second connector 23.

Figure 5:
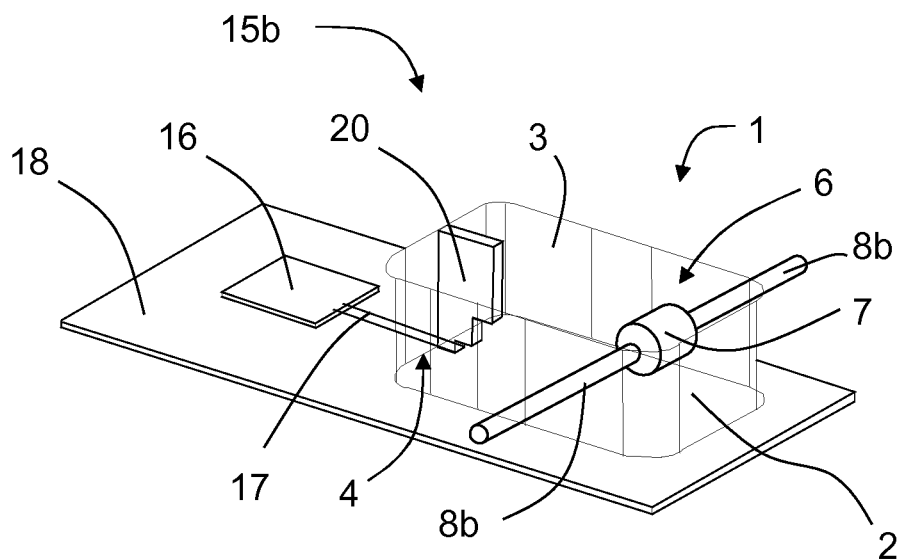
FIG. 5 shows a schematic perspective view of an oscillator according to a third example of the present disclosure.

As shown in a schematic perspective view of a third example of an oscillator device 15b in FIG. 5, according to some aspects, the waveguide resonator 1 comprises a coupling arrangement that comprises a waveguide ridge 20 that is electrically connected to the waveguide part 2. The waveguide ridge 20 is constituted by an electrically conducting structure that extends towards the first connector 17 inside the waveguide part 2 in a stepped or slanted manner.

Figure 6:
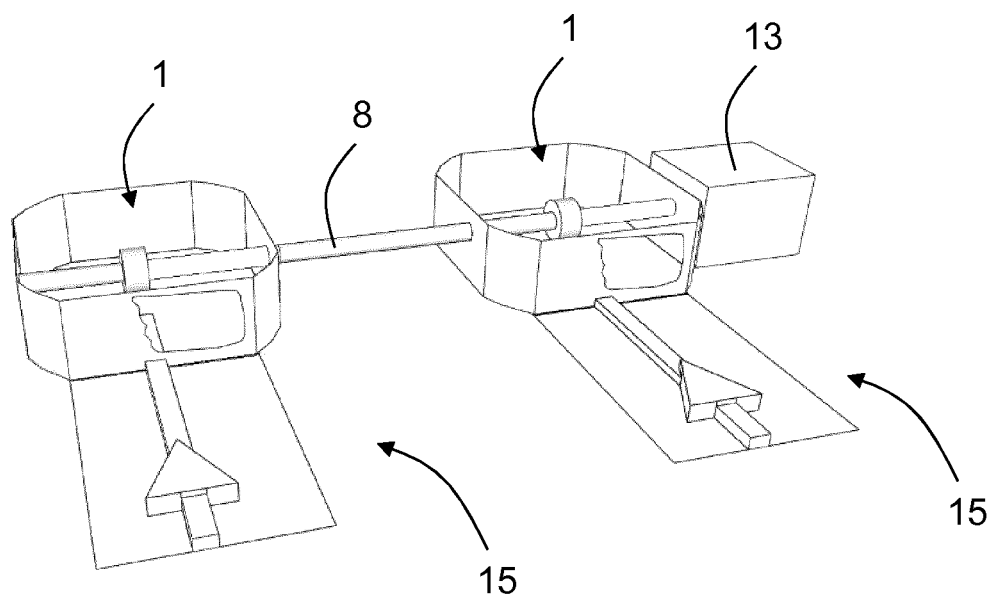
FIG. 6 shows a schematic perspective view of an oscillator according to a fourth example of the present disclosure.

As shown in a schematic perspective view of a third example in FIG. 6, two adjacent oscillator devices 15 comprises waveguide resonators 1 where a common holding rod 8 is connected to an electrically controllable motor 13.

For reasons of clarity, only the inner walls are indicated in FIGS. 2 and 4-6 although, in practice, the walls have a certain thickness with an outer side and an inner side and may be referred to as walls as well as inner walls in the description. It should be understood that in this context, it is the electrically conducting surfaces of the inner walls that define the cavities in question. In FIG. 1 and FIG. 3, the walls are shown having a certain thickness T, defining a certain inner width $W_r$ and inner length $L_r$ for the rectangular waveguide part 2.

Three types of a temperature compensated phase-locked loop (PLL) with the oscillator device 15 will now be described with reference to corresponding schematic circuit diagrams of a PLL in FIG. 7, FIG. 8 and FIG. 9.

Figure 7:
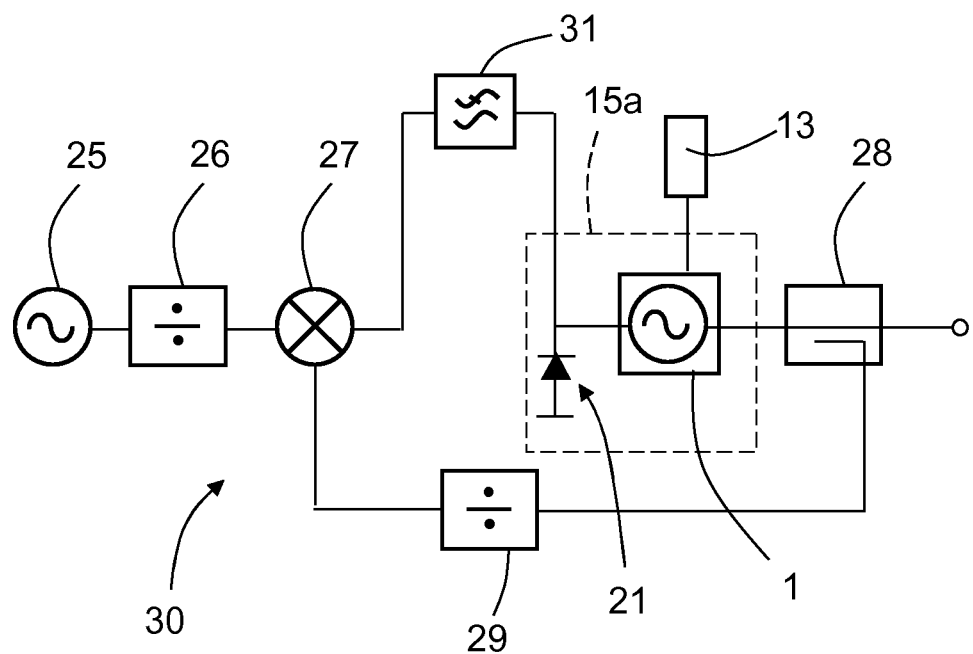
FIG. 7 shows a first schematic circuit diagram of a PLL.

In FIG. 7 there is a first example of a PLL 30 with a reference frequency oscillator 25, a first frequency divider 26 and a multiplier 27 which are connected in series. Here, the oscillator device 15a comprises a varactor diode 21 as described for the second example of an oscillator device 15a, which varactor diode 21 is loosely linked to the field in the waveguide resonator 1, controlling the frequency. The multiplier 27 is adapted to multiply a scaled output from the oscillator device 15a provided by a coupler 28 and divided by a second frequency divider 29. The multiplier 27 is adapted to output a resulting signal to the varactor diode 21 via a first low-pass filter 31. An electrically controllable motor 13 is adapted for frequency tuning together with the varactor diode 21, here the motor 13 is controlled by means of for example dead reckoning.

Figure 8:
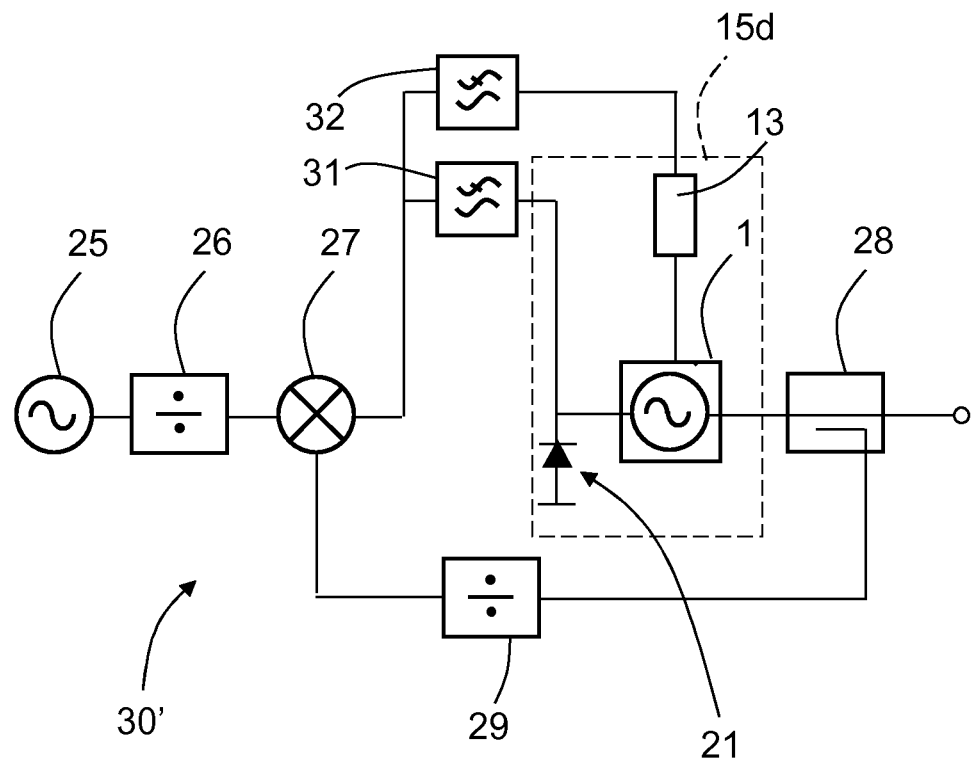
FIG. 8 shows a second schematic circuit diagram of a PLL.

In FIG. 8, there is a second example of a PLL 30' which is similar to the one in the first example. Here, however, the multiplier 27 is adapted to output a resulting signal to both the varactor diode 21 and the electrically controllable motor 13 via a corresponding first low-pass filter 31 and second low-pass filter 32.

Figure 9:
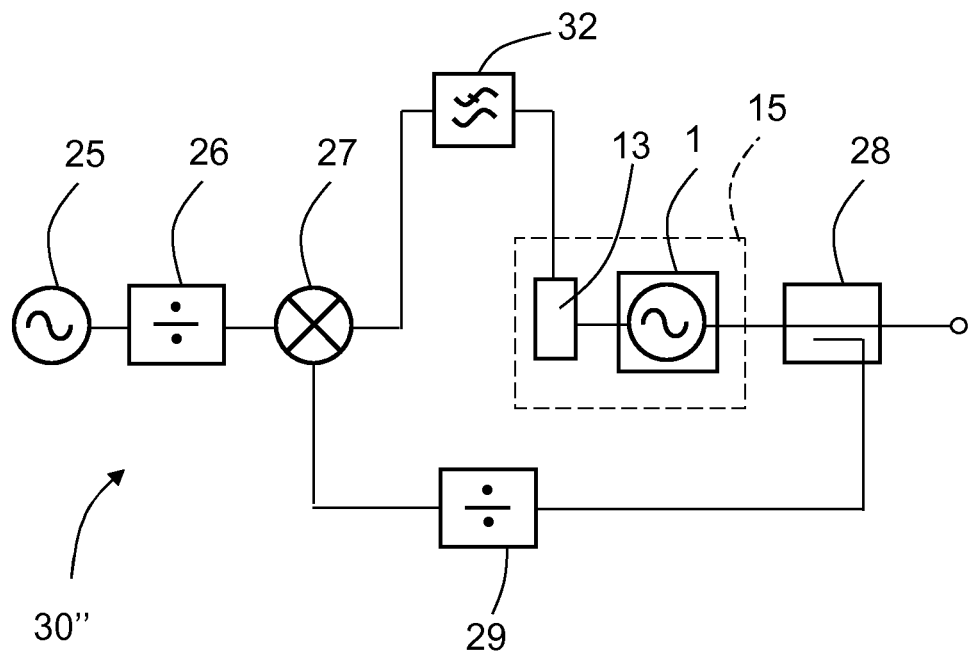
FIG. 9 shows a third schematic circuit diagram of a PLL.

In FIG. 9, there is a third example of a PLL 30" which is similar to the one in the second example, except that the oscillator device 15 here corresponds to the one described in the first example of an oscillator device 15d, not having any varactor diode. The multiplier 27 is adapted to output a resulting signal to the electrically controllable motor 13 via a second low-pass filter 32.

The present disclosure is not limited to the above, but may vary within the scope of the appended claims. For example, the waveguide part 2 can be square, rectangular, hexagonal, etc.

According to some aspects, the electrically controllable motor can be any type of motor, for example a servo motor or a step motor. Other types of electrically controllable means intended to move the electrically conducting body 7 within the waveguide part 2 are also comprised in the term "electrically controllable motor", for example a means that comprises a material that expands when heated and retracts when cooling.

Where applicable, instead of using a varactor diode, other alternatives can be used. According to some aspects, the amplifier feeding can be controlled in any suitable well-known manner.

According to some aspects, the waveguide part 2 can be square, rectangular, hexagonal, etc.

The waveguide part 2 as well as the electrically conducting body 7 can be made in any suitable metal such as aluminum, or as a metal plating on a non-conducting material such as plastics. A metal plating can also be used to cover another metal totally or partially.

Other types of connections are conceivable between each amplifier unit and the waveguide part 2, for example by means of bond wires or other types of probes that enter the cavity via an opening 4 in the waveguide part 2. Bond wires can also be used for connecting the amplifier unit 16 to the first connector 17.

According to some aspects, the amplifier unit can comprise one or more discrete or integrated amplifiers.

As mentioned previously, the waveguide part 2 of the waveguide resonator 1 can be in the form of a Surface Mountable Waveguide (SMW) part mounted to the PCB 18. Other arrangements are of course conceivable, for example the waveguide part 2 may be formed by electrically conducting parts that are connected to one or more amplifier units according to the above in any convenient manner, for example by means of bond wires or similar probes as mentioned above.

Generally, the present disclosure relates to an oscillator device 15 comprising an amplifier unit 16 and a tunable waveguide resonator 1, the tunable waveguide resonator 1 comprising a rectangular waveguide part 2 having electrically conducting inner walls 3 and a first waveguide port 4, where the amplifier unit 16 is arranged to be electrically connected to the waveguide resonator 1 via the first waveguide port 4 by means of a first connector 17, where the waveguide resonator 1 comprises at least one tuning element 6 positioned within the waveguide part 2, wherein each tuning element 6 comprises an electrically conducting body 7 and a holding rod 8a, 8b, where the holding rod 8a, 8b is attached to the electrically conducting body 7 and is movable from the outside of the waveguide resonator 1 such that the electrically conducting body 7 can be moved between a plurality of positions within the waveguide part 2 by means of the holding rod 8a, 8b.

According to some aspects, the waveguide part 2 comprises a surface-mountable waveguide part 2a, which is arranged to be mounted to a printed circuit board (PCB) 18 such that a metallization on the PCB 18 constitutes an inner wall 3a of the waveguide part 2.

According to some aspects, the amplifier unit 16 is positioned outside the waveguide part 2 and is arranged to be electromagnetically connected to the waveguide part 2 via an opening 4, said opening constituting the first waveguide port.

According to some aspects, the oscillator device 15 comprises a coupling arrangement that comprises a coupling patch 19 connected to the first connector 17.

According to some aspects, the oscillator device 15 comprises a coupling arrangement that comprises a waveguide ridge 20 that is electrically connected to the waveguide part 2.

According to some aspects, the holding rod 8a, 8b is electrically conducting.

According to some aspects, the holding rod 8a, 8b is extending through the waveguide part 2 via corresponding apertures 9, 10, where these apertures 9, 10 cross a plane 11 running through the waveguide part 2 parallel to an extension axis 12 of the holding rod 8a, 8b when mounted, where only a mode with an electrical wall in the plane 11 is excited within the apertures 9, 10 such that power leakage via the apertures 9, 10 is avoided.

According to some aspects, the holding rod 8a, 8b is connected to an electrically controllable motor 13.

According to some aspects, the electrically conducting body 7 is a cylindrical part.

According to some aspects, the tuning element 6 is integrally formed as one part.

According to some aspects, the holding rod comprises two separate rod parts 8a, 8b that are attached to opposite sides of the electrically conducting body 7.

According to some aspects, the holding rod 8a, 8b comprises one integral part that is running through the electrically conducting body 7.

According to some aspects, the oscillator device 15 comprises a varactor diode 21 that is arranged to be electrically connected to the waveguide resonator 1 via a second waveguide port 22 by means of a second connector 23.

The invention claimed is:

1. An oscillator device, comprising
an amplifier unit; and
a tunable waveguide resonator, the tunable waveguide resonator comprising:
a rectangular waveguide part configured for a fundamental TE101 mode and comprising:
electrically conducting inner walls;
a first waveguide port;
at least one tuning element positioned within the waveguide part, wherein each tuning element comprises an electrically conducting body and a holding rod;
wherein the amplifier unit is configured to be electrically connected to the waveguide resonator via the first waveguide port by a first connector;
wherein the holding rod is attached to the electrically conducting body and is movable from the outside of the waveguide resonator such that the electrically conducting body can be moved between a plurality of positions within the waveguide part via the holding rod;
wherein the holding rod extends through the waveguide part via corresponding apertures, wherein the apertures cross a plane running through the waveguide part parallel to an extension axis of the holding rod; wherein the plane is positioned such it lies in an electrical wall.

2. The oscillator device of claim 1, wherein the waveguide part comprises a surface-mountable waveguide part configured to be mounted to a printed circuit board (PCB) such that a metallization on the PCB constitutes an inner wall of the waveguide part.

3. The oscillator device of claim 1, wherein the amplifier unit is positioned outside the waveguide part and is configured to be electromagnetically connected to the waveguide part via an opening, the opening constituting the first waveguide port.

4. The oscillator device of claim 1, wherein the oscillator device further comprises a coupling arrangement that comprises a coupling patch connected to the first connector.

5. The oscillator device of claim 1, wherein the oscillator device further comprises a coupling arrangement that comprises a waveguide ridge that is electrically connected to the waveguide part.

6. The oscillator device of claim 1, wherein the holding rod is electrically conducting.

7. The oscillator device of claim 1, wherein the holding rod is connected to an electrically controllable motor.

8. The oscillator device of claim 1, wherein the electrically conducting body is a cylindrical part.

9. The oscillator device of claim 1, wherein the tuning element is integrally formed as one part.

10. The oscillator device of claim 1, wherein the holding rod comprises two separate rod parts that are attached to opposite sides of the electrically conducting body.

11. The oscillator device of claim 1, wherein the holding rod comprises one integral part that extends through the electrically conducting body.

12. The oscillator device of claim 1, wherein the oscillator device further comprises a varactor diode electrically connected to the waveguide resonator via a second waveguide port via a second connector.

\* \* \* \* \*